United States Patent
Chen

(10) Patent No.: US 7,777,326 B2
(45) Date of Patent: Aug. 17, 2010

(54) ROUTING STRUCTURE OF RE-DISTRIBUTION LAYER AND METHOD FOR RE-DISTRIBUTING ROUTING STRUCTURE IN INTEGRATED CIRCUIT

(75) Inventor: Xiaoshan Chen, Shanghai (CN)

(73) Assignee: VIA Technologies, Inc., Taipei Hsien (TW)

( * ) Notice: Subject to any disclaimer, the term of this patent is extended or adjusted under 35 U.S.C. 154(b) by 157 days.

(21) Appl. No.: 12/207,676

(22) Filed: Sep. 10, 2008

(65) Prior Publication Data

US 2009/0212424 A1 Aug. 27, 2009

(30) Foreign Application Priority Data

Feb. 27, 2008 (CN) .................... 2008 1 0074181

(51) Int. Cl.
*H01L 23/52* (2006.01)
(52) U.S. Cl. .................. 257/691; 257/738; 257/773; 257/781; 257/784; 257/E23.079; 438/614
(58) Field of Classification Search .............. 257/691, 257/737, 738, 773, 780–782, 784, E23.079
See application file for complete search history.

(56) References Cited

U.S. PATENT DOCUMENTS

| 6,653,726 B1 * | 11/2003 | Schultz et al. | 257/691 |
| 7,307,340 B2 * | 12/2007 | Baek et al. | 257/723 |
| 7,462,941 B2 * | 12/2008 | Campbell et al. | 257/781 |

* cited by examiner

*Primary Examiner*—Jasmine J Clark
(74) *Attorney, Agent, or Firm*—J.C. Patents

(57) ABSTRACT

A routing structure of an RDL of a chip is provided. The routing structure comprises a power route, a plurality of first stripes, a ground route, and a plurality of second stripes. The power route is arranged in a first direction and comprises a plurality of first bumps and a plurality of first line segments. Each of the first line segments connects adjacent first bumps. The first stripes are arranged in a second direction and connected to the power route. The ground route is disposed at one side of the power route in a third direction, and comprises a plurality of second bumps and a plurality of second line segments. Each of the second line segments connects adjacent second bumps. The second stripes, are arranged in a forth direction and connected to the ground route. The first stripes and the second stripes are interleaved without intersecting one another.

19 Claims, 2 Drawing Sheets

ROUTING STRUCTURE OF RE-DISTRIBUTION LAYER AND METHOD FOR RE-DISTRIBUTING ROUTING STRUCTURE IN INTEGRATED CIRCUIT

CROSS-REFERENCE TO RELATED APPLICATION

This application claims the priority benefit of China application serial no. 200810074181.7, filed on Feb. 27, 2008. The entirety of the above-mentioned patent application is hereby incorporated by reference herein and made a part of specification.

BACKGROUND OF THE INVENTION

1. Field of the Invention

The present invention generally relates to a routing structure, in particular, to a routing structure and a routing method of a re-distribution layer (RDL).

2. Description of Related Art

In modern time, the multimedia application market is expanding quickly. The packaging technique of integrated circuits must be developed to meet the development of such electronic devices. In order to achieve the above requirements, it is necessary to strengthen the features of high-speed processing, multifunction, integration, small scale and light-weight, low price, etc. of the electronic devices. Accordingly, the development of the packaging technique of integrated circuits also tends towards minimization and high density of the size.

The packaging density of an integrated circuit refers to the number of pins in a unit area. For a high-density integrated circuit package, reduction of the wire length between the integrated circuit and the package substrate benefits the speed of signal transmissions. Therefore, the flip-chip package technique using routes for transmitting signals has become the mainstream technique in the high-density package.

For example, bumps of a wiring bonding chip are usually arranged in a peripheral type, and are electrically connected to wire bumps on a package substrate through wires. Meanwhile bumps on a flip chip are usually arranged in an array type, and are electrically connected to route bumps on the package substrate through routes. The flip-chip packaging technique has gradually become the mainstream technique, and more products are packaged by using the flip chip technique. However, altering the current design of a product to catch up with the change of package technique may not be cost effective.

Therefore, a pad re-distribution technique is developed. A re-distribution layer (RDL) is disposed on the top metal layer of the former wire bonding chip, the bumps originally arranged in the peripheral type of the wire bonding chip are re-distributed to become an array type of the flip chip bumps, for disposing the routes required by the flip-chip package.

However, the routing structure of the RDL of the conventional art focuses more on how to provide the power source to a core circuit in the chip instead of reducing the noises generated in the routing structure.

SUMMARY OF THE INVENTION

Accordingly, the present invention is directed to a routing structure of an RDL, capable of effectively reducing noises.

The present invention provides a routing structure of an RDL, disposed on a top metal layer of a chip. The routing structure comprises a power route, a plurality of first stripes, a ground route, and a plurality of second stripes. The power route is arranged in a first direction and comprises a plurality of first bumps and a plurality of first line segments. Each of the first line segments connects adjacent first bumps. The first stripes are arranged in a second direction and connected to the power route. The ground route is disposed at one side of the power route in a third direction, and comprises a plurality of second bumps and a plurality of second line segments. Each of the second line segments connects adjacent second bumps. The second stripes, are arranged in a forth direction and connected to the ground route. The first stripes and the second stripes are interleaved without intersecting one another.

According to an embodiment of the present invention, at least one end of a portion of the first stripes is connected to the first bumps. Furthermore, at least one end of the other portion of the first stripes is connected to the first line segments.

According to an embodiment of the present invention, at least one end of a portion of the second stripes is connected to the second bumps. Furthermore, at least one end of the other portion of the second stripes is connected to the second line segments.

According to an embodiment of the present invention, a first angle formed between the first direction and the second direction is equal to or less than 90 degree.

According to an embodiment of the present invention, a second angle formed between the third direction and the forth direction is equal to or less than 90 degree.

According to an embodiment of the present invention, the first stripes and the second stripes are arranged in parallel.

According to an embodiment of the present invention, the chip is packaged by wire bonding.

A method for re-distributing routing structure in an integrated circuit is also provided. The method comprises: disposing a first route in a first direction, the first route comprising a plurality of first bumps and a plurality of first line segments, each of the first line segments connecting adjacent first bumps; disposing a plurality of first stripes connected to the first route in a second direction; disposing a second route in a third direction, the second route comprising a plurality of second bumps and a plurality of second line segments, each of the second line segments connecting adjacent second bumps, and the second route disposed neighboring to the first route; and, disposing a plurality of second stripes connected to the second route in a forth direction, wherein the plurality of first stripes and the plurality of second stripes are interleaved without intersecting each other.

According to an embodiment of the present invention, the disposing of the plurality of the first stripes comprises connecting at least one end of a portion of the plurality of the first stripes to the first bumps.

According to an embodiment of the present invention, the disposing of the plurality of the first stripes further comprises connecting at least one end of the other portion of the plurality of the first stripes to the first line segments.

According to an embodiment of the present invention, the disposing of the plurality of the second stripes comprises connecting at least one end of a portion of the plurality of the second stripes to the second bumps.

According to an embodiment of the present invention, the disposing of the plurality of the second stripes further comprises connecting at least one end of the other portion of the plurality of the second stripes to the second line segments.

According to an embodiment of the present invention, the first direction and the second direction are arranged to form a first angle equal to or less than 90 degree.

According to an embodiment of the present invention, the third direction and the forth direction are arranged to form a second angle equal to or less than 90 degree.

According to an embodiment of the present invention, the first stripes and the second stripes are arranged in parallel.

According to an embodiment of the present invention, the integrated circuit is packaged by wire bonding.

According to an embodiment of the present invention, the re-distributing is performed on a re-distribution layer of the integrated circuit.

Based on the above, the routing structure of the RDL provided by the present invention has the first stripes and the second stripes which are interleaved without intersecting one another, thereby greatly increasing the effect of the de-coupling capacitor to filter the noises in the routing structure and effectively reduce the noises.

In order to the make aforementioned and other objects, features and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
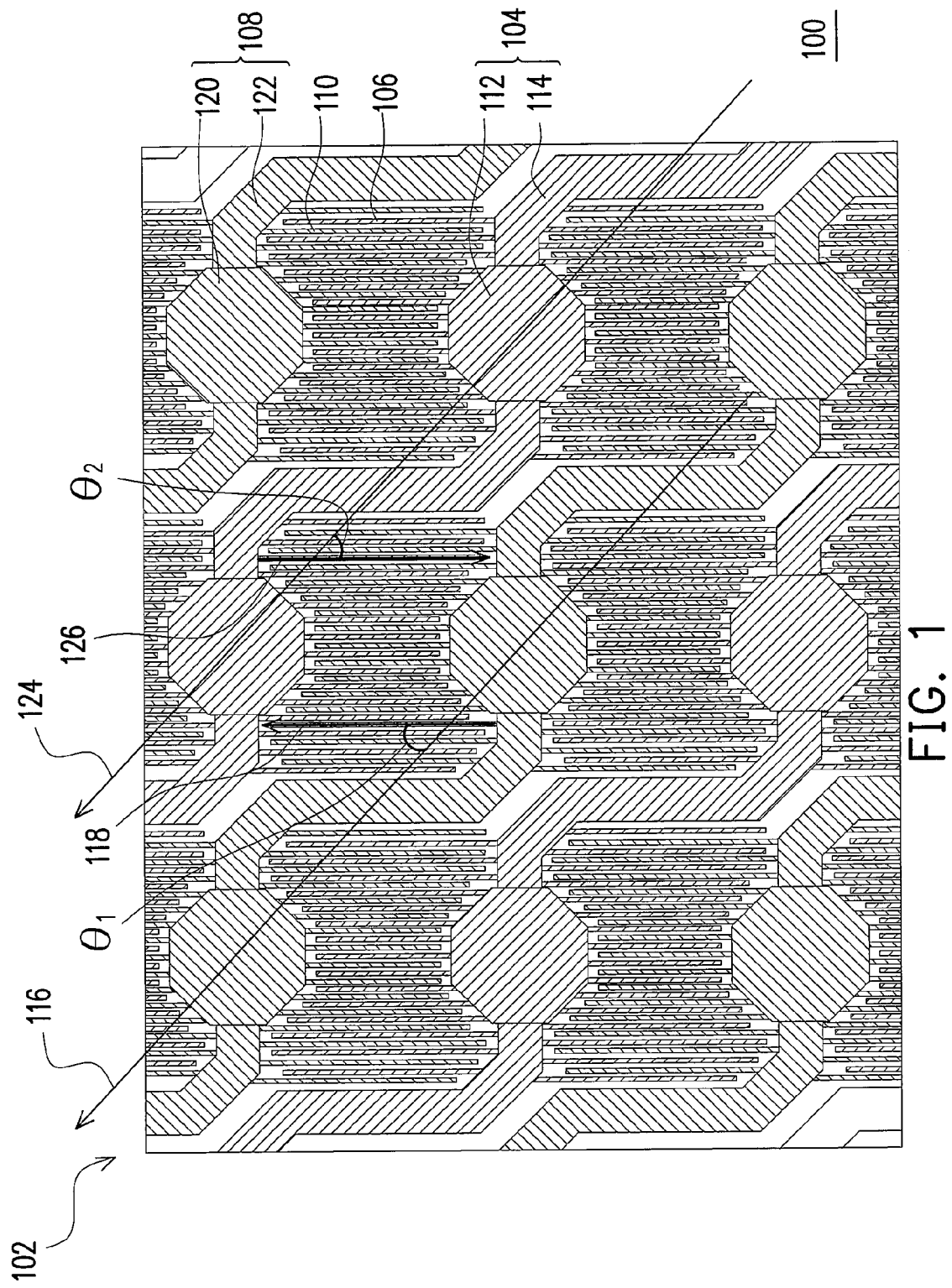
FIG. 1 is a top view of a routing structure of a RDL according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a top view of a routing structure of a RDL according to an embodiment of the present invention.

Referring to FIG. 1, the routing structure 102 of the RDL is disposed on a top metal layer of an IC chip 100, for re-distributing the bumps (not shown) on the chip 100 and providing power source to a core circuit (not shown) in the chip 100.

The routing structure 102 includes a power route 104, a plurality of first stripes 106, a ground route 108, and a plurality of second stripes 110. The material of the routing structure 102 may be a metal, for example, copper.

The power route 104 includes power bumps 112 and power line segments 114. Each of the power line segments 114 connects two adjacent power bumps 112. The power route 104 extends, for example, along a first extending direction 116.

The first stripes 106 are connected to the power route 104 and extend along a second direction 118. In the present embodiment, some of the first stripes 106 are connected to the power bumps 112, and others are connected to the power line segments 114. However, in other embodiments of the present invention, all of the first stripes 106 may be connected to the power bumps 112 or connected to the power line segments 114. The first stripes 106 are, for example, arranged in parallel to one another. An angle θ1 formed between the second direction 118 of the first stripes 106 and the first direction 116 of the power route 104 is, for example, an acute angle which is less than 90 degree.

In this embodiment, for example, the first stripes 106 are connected to the power bumps 112 and the power line segments 114 both. However it is not intended to limit the scope of the present invention to this embodiment. The first stripes 106 may be connected to only the power bumps and a portion of the power line segments 114, or the like. One of ordinary skill in the art can realize that to achieve the purpose of the present invention of increasing de-coupling capacitors, the first stripes 106 need only be connected to at least one of the power bumps 112 and the power line segments 114, and the first stripes 106 and the second stripes 110 should be interleaved without intersecting one another.

The ground route 108 is disposed neighborly to the power route 104, and includes a plurality of ground bumps 120 and a plurality of ground line segments 122. Each of the ground line segments 122 connects two adjacent ground bumps 120. The ground route 108, for example, extends along a third direction 124. The third direction 124 of the ground route 108 and the first direction 116 of the power route 104 are, for example, arranged in parallel to one another.

The second stripes 110 are connected to the ground route 108. The first stripes 106 and the second stripes 110 are interleaved without intersecting one another. In the present embodiment, one ends of the second stripes 110 are connected to the ground bumps 120 or the ground line segments 122, and the other ends of the second stripes extend toward a forth direction 126. However, in other embodiments of the present invention, both ends of the second stripes 110 may be connected to the ground bumps 120 or connected to the ground line segments 122. The second stripes 110 are, for example, arranged in parallel to one another. An angle θ2 formed between the forth direction 126 of the second stripes 110 and the third direction 124 of the ground route 108 is, for example, an acute angle which is less than 90 degree.

In this embodiment, the second stripes 110 are connected to the ground bumps 120 and the ground line segments 122 at both ends, but it is not intended to limit the scope of the present invention to this embodiment. However those of ordinary art in the art would realize that to achieve the purpose of the present invention of increasing de-coupling capacitors, the second stripes 110 need only be connected to at least one of the ground bumps 120 and the ground line segments 122, and the first stripes 106 and the second stripes 110 are interleaved without intersecting one another.

Summing from above embodiments, the routing structure 202 of the RDL may have increased de-coupling capacitors by disposing interleaved and non-intersecting first stripes 106 and second stripes 110. Consequently, the noise within the routing structure 202 can be filtered and thus decreases noise effect.

Figure 2:
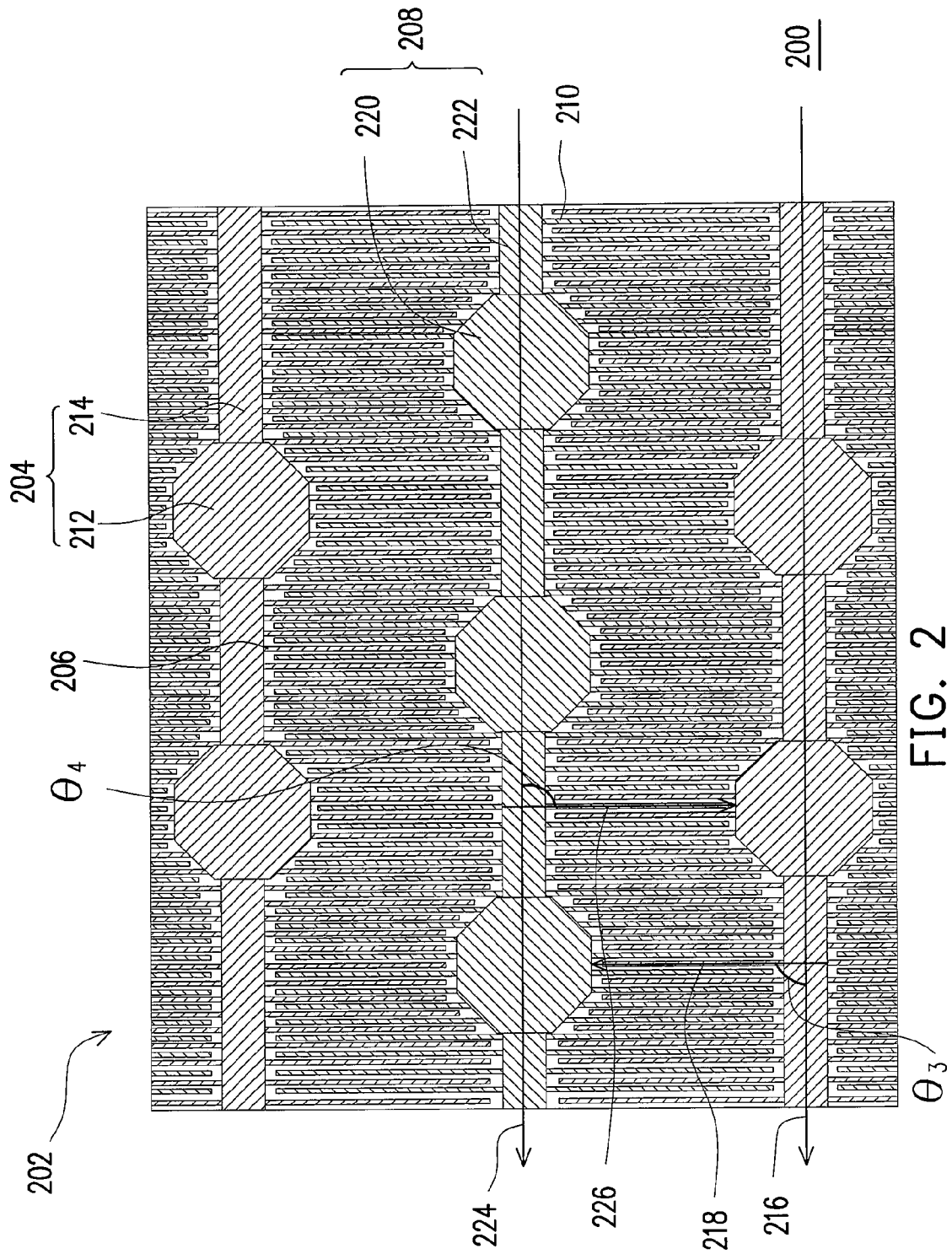
FIG. 2 is a top view of a routing structure of a RDL according to another embodiment of the present invention.

FIG. 2 is a top view of a routing structure of a RDL according to another embodiment of the present invention.

Comparing FIGS. 1 and 2, a routing structure 202 of the RDL is disposed on a top metal layer of a chip 200 in the embodiment of FIG. 2. The routing structure 202 includes a power route 204, a plurality of first stripes 206, a ground route 208, and a plurality of second stripes 210. The power route 204 includes a plurality of power bumps 212 and a plurality of power line segments 214, and the ground route 208 includes a plurality of ground bumps 220 and a plurality of ground line segments 222.

The main difference between the embodiment of FIG. 2 and the embodiment of FIG. 1 is described as follows. An angle θ3 formed between a fifth direction 216 of the power route 204 and a sixth direction 218 of the first stripes 206 is a right angle which equals 90 degree. An angle θ4 formed between a seventh direction 224 of the ground route 208 and an eighth direction 226 of the second stripes 210 is also a right angle (referring to FIG. 2). However, referring to FIG. 1, the angle θ1 formed between the second direction 118 of the first stripes 106 and the first direction 116 of the power route 104 is an acute angle which is less than 90 degree. The angle θ2 formed between the forth direction 124 of the ground route 108 and the third direction 126 of the second stripes 110 is also an acute angle. Other than above feature, the material, arrangement manner, and function of other components in the embodiment of FIG. 2 are substantially the same as the components in the embodiment of FIG. 1, so the details will not be repeated herein.

In view of the above, the first stripes 206 and the second stripes 210 are interleaved without intersecting one another, thereby greatly increasing the effect of the de-coupling capacitor to filter the noises in the routing structure 202 and effectively reduce the noises.

To sum up, the routing structure of the RDL of the present invention can greatly increase the effect of the de-coupling capacitor, and thereby the noises interference can be effectively eliminated by the de-coupling capacitor to improve the signal transmission performance in the RDL.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A routing structure of a re-distribution layer (RDL), disposed on a top metal layer of a chip, comprising:
   a power route, arranged in a first direction and comprising a plurality of first bumps and a plurality of first line segments, each of the first line segments connecting adjacent first bumps;
   a plurality of first stripes, arranged in a second direction and connected to the power route;
   a ground route, disposed at one side of the power route in a third direction, and comprising a plurality of second bumps and a plurality of second line segments, each of the second line segments connecting adjacent second bumps; and
   a plurality of second stripes, arranged in a forth direction and connected to the ground route, wherein the first stripes and the second stripes are interleaved without intersecting one another.

2. The routing structure of an RDL according to claim 1, wherein at least one end of a portion of the first stripes is connected to the first bumps.

3. The routing structure of an RDL according to claim 2, wherein at least one end of the other portion of the first stripes is connected to the first line segments.

4. The routing structure of an RDL according to claim 1, wherein at least one end of a portion of the second stripes is connected to the second bumps.

5. The routing structure of an RDL according to claim 4, wherein at least one end of the other portion of the second stripes is connected to the second line segments.

6. The routing structure of an RDL according to claim 1, wherein a first angle formed between the first direction and the second direction is equal to or less than 90 degree.

7. The routing structure of an RDL according to claim 1, wherein a second angle formed between the third direction and the forth direction is equal to or less than 90 degree.

8. The routing structure of an RDL according to claim 1, wherein the first stripes and the second stripes are arranged in parallel.

9. The routing structure of an RDL according to claim 1, wherein the chip is packaged by wire bonding.

10. A method for re-distributing routing structure in an integrated circuit, comprising:
    disposing a first route in a first direction, the first route comprising a plurality of first bumps and a plurality of first line segments, each of the first line segments connecting adjacent first bumps;
    disposing a plurality of first stripes connected to the first route in a second direction;
    disposing a second route in a third direction, the second route comprising a plurality of second bumps and a plurality of second line segments, each of the second line segments connecting adjacent second bumps, and the second route disposed neighboring to the first route; and
    disposing a plurality of second stripes connected to the second route in a forth direction,
    wherein the plurality of first stripes and the plurality of second stripes are interleaved without intersecting each other.

11. The method according to claim 10, wherein the disposing of the plurality of the first stripes comprises connecting at least one end of a portion of the plurality of the first stripes to the first bumps.

12. The method according to claim 11, wherein the disposing of the plurality of the first stripes further comprises connecting at least one end of the other portion of the plurality of the first stripes to the first line segments.

13. The method according to claim 10, wherein the disposing of the plurality of the second stripes comprises connecting at least one end of a portion of the plurality of the second stripes to the second bumps.

14. The method according to claim 13, wherein the disposing of the plurality of the second stripes further comprises connecting at least one end of the other portion of the plurality of the second stripes to the second line segments.

15. The method according to claim 10, wherein the first direction and the second direction are arranged to form a first angle equal to or less than 90 degree.

16. The method according to claim 10, wherein the third direction and the forth direction are arranged to form a second angle equal to or less than 90 degree.

17. The method according to claim 10, wherein the first stripes and the second stripes are arranged in parallel.

18. The method according to claim 10, wherein the integrated circuit is packaged by wire bonding.

19. The method according claim 10, wherein the re-distributing is performed on a re-distribution layer of the integrated circuit.

* * * * *